United States Patent
Zimmer et al.

(10) Patent No.: US 10,712,176 B2
(45) Date of Patent: Jul. 14, 2020

(54) XMR ANGLE SENSORS

(71) Applicant: Infineon Technologies AG, Neubiberg (DE)

(72) Inventors: Juergen Zimmer, Neubiberg (DE); Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 15/652,646

(22) Filed: Jul. 18, 2017

(65) Prior Publication Data

US 2017/0314965 A1 Nov. 2, 2017

Related U.S. Application Data

(63) Continuation of application No. 14/535,537, filed on Nov. 7, 2014, now Pat. No. 9,733,107, which is a (Continued)

(51) Int. Cl.
*G01D 5/16* (2006.01)
*G01R 33/09* (2006.01)
(Continued)

(52) U.S. Cl.
CPC .............. *G01D 5/16* (2013.01); *G01B 7/30* (2013.01); *G01R 33/02* (2013.01); *G01R 33/09* (2013.01);
(Continued)

(58) Field of Classification Search
CPC ......... G01D 5/16; H04L 47/525; H04L 47/72; H04L 47/781; H04L 47/805;
(Continued)

(56) References Cited

U.S. PATENT DOCUMENTS 6,002,553 A   12/1999   Stearns
6,232,776 B1   5/2001   Pant
(Continued)

FOREIGN PATENT DOCUMENTS

DE        4327458        2/1995
DE     196 08 730 A1     9/1997
(Continued)

OTHER PUBLICATIONS

Notice of Allowance dated Jun. 4, 2014 for U.S. Appl. No. 13/165,940.
(Continued)

*Primary Examiner* — Son T Le
(74) *Attorney, Agent, or Firm* — Eschweiler & Potashnik, LLC

(57) ABSTRACT

Embodiments relate to xMR sensors, in particular AMR and/or TMR angle sensors with an angle range of 360 degrees. In embodiments, AMR angle sensors with a range of 360 degrees combine conventional, highly accurate AMR angle structures with structures in which an AMR layer is continuously magnetically biased by an exchange bias coupling effect. The equivalent bias field is lower than the external rotating magnetic field and is applied continuously to separate sensor structures. Thus, in contrast with conventional solutions, no temporary, auxiliary magnetic field need be generated, and embodiments are suitable for magnetic fields up to about 100 mT or more. Additional embodiments relate to combined TMR and AMR structures. In such embodiments, a TMR stack with a free layer functioning as an AMR structure is used. With a single such stack, contacted in different modes, a high-precision angle sensor with 360 degrees of uniqueness can be realized.

15 Claims, 15 Drawing Sheets

Related U.S. Application Data continuation of application No. 13/165,940, filed on Jun. 22, 2011, now Pat. No. 8,884,616.

(51) Int. Cl.
| | |
|---|---|
| *G01R 33/02* | (2006.01) |
| *G01B 7/30* | (2006.01) |
| *H04L 12/877* | (2013.01) |
| *H04L 12/911* | (2013.01) |
| *H04L 12/927* | (2013.01) |
| *H04L 12/863* | (2013.01) |

(52) U.S. Cl.
CPC ......... *G01R 33/093* (2013.01); *G01R 33/096* (2013.01); *H04L 47/525* (2013.01); *H04L 47/72* (2013.01); *H04L 47/781* (2013.01); *H04L 47/805* (2013.01); *H04L 47/6215* (2013.01)

(58) Field of Classification Search
CPC ..... H04L 47/6215; G01R 33/02; G01R 33/09; G01R 33/093; G01R 33/096; G01B 7/30
See application file for complete search history.

(56) References Cited

U.S. PATENT DOCUMENTS

| | | | |
|---|---|---|---|
| 6,433,535 B1 | 8/2002 | Marx | |
| 6,462,641 B1 * | 10/2002 | Dieny | B82Y 10/00 338/32 R |
| 6,529,352 B1 | 3/2003 | Ural | |
| 6,707,122 B1 | 3/2004 | Hines | |
| 6,831,456 B2 | 12/2004 | Doescher | |
| 7,265,540 B2 | 9/2007 | Sudo | |
| 7,495,434 B2 | 2/2009 | Zimmer et al. | |
| 7,678,585 B2 | 3/2010 | Zimmer | |
| 7,682,840 B2 | 3/2010 | Hiebert | |
| 8,232,795 B2 | 7/2012 | Saruki | |
| 8,884,616 B2 | 11/2014 | Zimmer et al. | |
| 9,207,291 B2 | 12/2015 | Zimmer | |
| 2002/0171417 A1 | 11/2002 | Schodlbauer | |
| 2004/0257714 A1 | 12/2004 | Takahashi | |
| 2008/0074224 A1 | 3/2008 | Castano | |
| 2008/0088982 A1 | 4/2008 | Folks | |
| 2009/0015252 A1 * | 1/2009 | Raberg | B82Y 25/00 324/252 |
| 2010/0118447 A1 | 5/2010 | Hammerschmidt | |
| 2012/0070693 A1 * | 3/2012 | Abarra | B82Y 10/00 428/811.2 |
| 2012/0134057 A1 | 5/2012 | Song et al. | |
| 2013/0241542 A1 | 9/2013 | Schindler | |

FOREIGN PATENT DOCUMENTS

| | | |
|---|---|---|
| DE | 19839450 | 3/2000 |
| DE | 103 27 390 A1 | 1/2005 |
| DE | 10 2005 004 126 A1 | 8/2005 |
| DE | 102004032483 A1 | 1/2006 |
| DE | 10 2005 047 482 A1 | 4/2007 |
| DE | 10 2006 050 833 A1 | 5/2008 |
| DE | 10 2007 032 867 A1 | 1/2009 |
| DE | 10 2008 054 314 A1 | 6/2009 |
| WO | 2004/074764 | 9/2004 |
| WO | 2005/075943 | 8/2005 |

OTHER PUBLICATIONS

Non-Final Office Action dated Dec. 30, 2013 for U.S. Appl. No. 13/165,940.
Notice of Allowance dated Apr. 13, 2017 for U.S. Appl. No. 14/535,537.
Non-Final Office Action dated Oct. 28, 2016 for U.S. Appl. No. 14/535,537.
"KMT36H 360° Angular Sensor." Measurement Specialties. KMT36H Angular Sensor Rev. 1. www.meas-spec.com. Sep. 11, 2008. 6 pages.

* cited by examiner

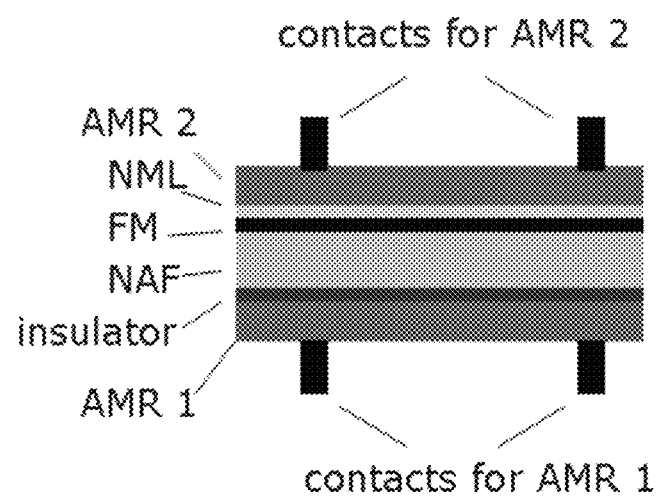
FIG. 5
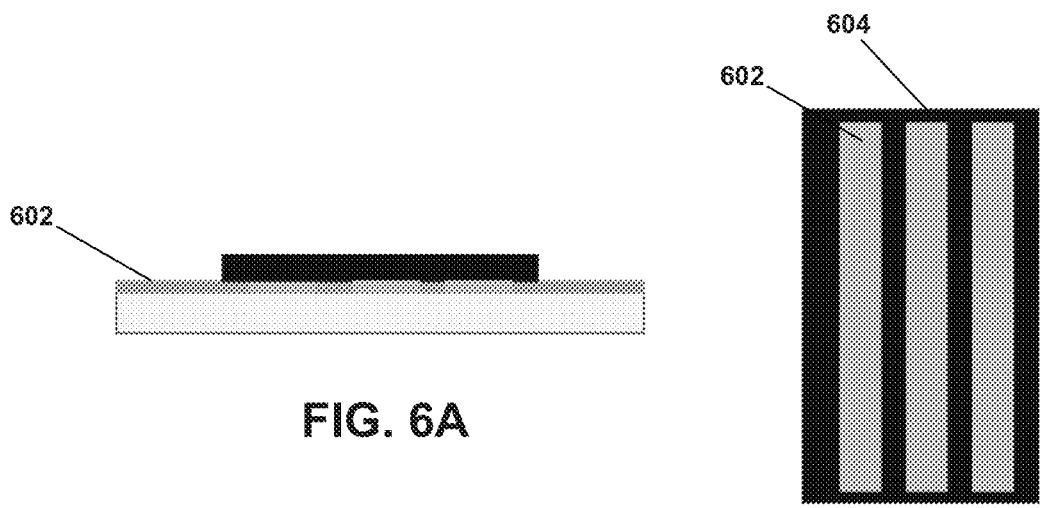
FIG. 6A
FIG. 6B

XMR ANGLE SENSORS

CROSS REFERENCE TO RELATED APPLICATION

This application is a continuation of application Ser. No. 14/535,537 filed on Nov. 7, 2014, which is a continuation of U.S. application Ser. No. 13/165,940 filed Jun. 22, 2011, the contents of which are hereby fully incorporated herein by reference.

FIELD

The invention relates generally to integrated circuit (IC) sensors and more particularly to magnetoresistive IC angle sensors having 360-degree uniqueness.

BACKGROUND

Magnetoresistive sensors can include anisotropic magnetoresistive (AMR), giant magnetoresistive (GMR), tunnel magnetoresistive (TMR) and other technologies, referred to collectively as xMR technologies. XMR sensors can be used for a variety of applications, including magnetic field and current sensors, speed sensors, rotation sensors and angle sensors, among others.

Conventional AMR angle sensors are inherently limited to an angle uniqueness of 180 degrees due to the 90-degree uniqueness of the AMR effect with respect to a rotating external in-plane field. Thus, there are many applications for angle sensors with greater than 180-degree range that are instead fulfilled by angle sensors based on GMR or TMR technology. These technologies, however, suffer from considerable accuracy drift, especially at high magnetic fields in combination with high temperatures, which prevents GMR usage in applications with high accuracy requirements. Because AMR technology exhibits no magnetic field dependent accuracy drift, it is typically the preferred technology choice for very high accuracy applications.

Solutions exist that attempt to extend the range of AMR angle sensors to 360 degrees. For example, some increase the anisotropic field strength using an additional device, such as an integrated coil or hard magnetic bias layer. Such solutions often require that the external magnetic field be lower than the sensor anisotropy field strength, though, which limits the usually desired high magnetic fields. Other solutions apply an additional, or "auxiliary," magnetic field, such as by integrated coils, which can be lower than the external magnetic field in order to allow the film magnetization to rotate. Drawbacks of these solutions, however, include increased power consumption and limited maximum measuring field, as well as increased measuring time due to the application of the temporary auxiliary field.

Therefore, a need remains for improved xMR sensors, including an AMR sensor having a 360-degree range.

SUMMARY

Embodiments relate to xMR sensors, sensor elements and structures, and methods, including AMR and/or TMR angle sensors having 360-degree ranges.

In an embodiment, An anisotropic magnetoresistive (AMR) angle sensor for measuring an external magnetic field with 360 degrees of uniqueness comprises a first AMR sensor element; and a second AMR sensor element which, in operation, is continuously biased with a bias magnetic field, the bias magnetic field being smaller than the external magnetic field.

In an embodiment, a method of determining a measured magnetic field angle having 360-degree uniqueness comprises providing an anisotropic magnetoresistive (AMR) angle sensor comprising first, second and third AMR sensor element arrangements, wherein AMR layers in the first AMR sensor element arrangement are exchange biased in a direction that is rotated with respect to a direction of exchange bias of AMR layers in the third AMR sensor element arrangement; measuring a first magnetic field angle by the second AMR sensor element arrangement; measuring second and third magnetic field angles by the first and third AMR sensor element arrangement, respectively; determining a first difference between the first and second magnetic field angles and a second difference between the first and third magnetic field angles; determining an arctan (ATAN) of a ratio of the first difference to the second difference; and determining a measured magnetic field angle having 360-degree uniqueness from the ATAN.

In an embodiment, a method of determining a measured magnetic field angle having 360-degree uniqueness comprises providing an anisotropic magnetoresistive (AMR) angle sensor comprising first, second and third AMR sensor element arrangements, wherein AMR layers in the first AMR sensor element arrangement are exchange biased in a direction that is rotated with respect to a direction of exchange bias of AMR layers in the third AMR sensor element arrangement; measuring a first magnetic field angle by the second AMR sensor element arrangement; measuring a second magnetic field angle by the first AMR sensor element arrangement; determining a first difference between the first and second magnetic field angles; determining a measured magnetic field angle having 360-degree uniqueness from the arctan (ATAN) according to the following: if the first magnetic field angle is greater than an angle B or if the first magnetic field angle is less than 180 degrees minus angle B, then the measured magnetic field angle is equal to the first magnetic field angle if the first difference is greater than 0, or the first magnetic field angle plus 180 degrees if the first difference is less than 0; and if the first magnetic field angle is less than the angle B or if the first magnetic field angle is greater than 180 degrees minus angle B, then measure a third magnetic field angle by the third AMR sensor element arrangement, calculate an ATAN of a ratio of the first and third magnetic field angles, if the ATAN minus 180 degrees is less than the first magnetic field angle, then the measured magnetic field angle is equal to the first magnetic field angle, and if the ATAN minus 180 degrees is greater than or equal to the first magnetic field angle, then the measured magnetic field angle is equal to the first magnetic field angle plus 180 degrees; where the angle B is an assumed absolute value of a deviation of orthogonality.

In an embodiment, an angle sensor for measuring an external magnetic field with 360 degrees of uniqueness comprises a tunneling magnetoresistive (TMR) stack having a tunneling barrier layer, a layer exhibiting an anisotropic magnetoresistive (AMR) effect and a first electrode on a first side of the tunneling barrier layer, a second electrode on a second side of the tunneling barrier layer, and first and second contact sets on the first side of the tunneling barrier, wherein the first electrode exhibits an AMR effect; wherein the TMR stack has a first sensor configuration when the first contact set is used and a second sensor configuration when the second contact set is used, the first and second contact sets having different contact distances.

In an embodiment, a method of determining a measured magnetic field angle having 360-degree uniqueness comprises providing a tunneling magnetoresistive (TMR) stack having a tunneling barrier layer, a layer exhibiting an anisotropic magnetoresistive (AMR) effect and a first electrode on a first side of the tunneling barrier layer, a second electrode on a second side of the tunneling barrier layer, and first and second contact sets on the first side of the tunneling barrier, wherein the first electrode exhibits an AMR effect; accessing a first sensor configuration of the TMR stack by the first contact set to measure a current-in-plane (CIP) TMR effect; accessing a second sensor configuration of the TMR stack by the second contact set to measure an AMR effect, the second contact set having a contact distance smaller than a contact distance of the first contact set; and using the CIP TMR effect and AMR effect to determine a 360-degree unique magnetic field angle.

In an embodiment, an angle sensor for measuring an external magnetic field with 360 degrees of uniqueness comprises a tunneling magnetoresistive (TMR) stack having a tunneling barrier layer, a layer exhibiting an anisotropic magnetoresistive (AMR) effect and a first electrode on a first side of the tunneling barrier layer, a second electrode on a second side of the tunneling barrier layer, a first contact set comprising contacts on the first and second sides of the tunneling barrier layer, and a second contact set on the first side of the tunneling barrier layer, wherein the first electrode exhibits an AMR effect; wherein the TMR stack has a first sensor configuration when the first contact set is used and a second sensor configuration when the second contact set is used, the first and second contact sets having different contact distances

BRIEF DESCRIPTION OF THE DRAWINGS

The invention may be more completely understood in consideration of the following detailed description of various embodiments of the invention in connection with the accompanying drawings, in which:

FIG. 5 is a block diagram of an AMR stack according to an embodiment.
FIG. 6A is a side view block diagram of an AMR stack according to an embodiment.
FIG. 6B is a top view block diagram of an AMR stack according to an embodiment.

Figure 1A:
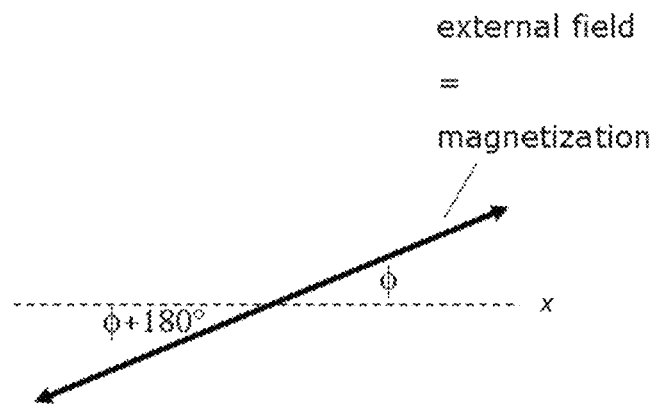
FIG. 1A is an angle diagram according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to xMR sensors, in particular AMR angle sensors with an angle range of 360 degrees. In embodiments, AMR angle sensors with a range of 360 degrees combine conventional, highly accurate AMR angle structures with structures in which an AMR layer is continuously magnetically biased by an exchange bias coupling effect. The equivalent bias field is lower than the external rotating magnetic field and is applied continuously to separate sensor structures. Thus, in contrast with conventional solutions, no temporary, auxiliary magnetic field needs to be generated, and embodiments are suitable for magnetic fields up to about 100 mT or more. Additional embodiments relate to combined TMR and AMR structures. In such embodiments, a TMR stack with a free layer functioning as an AMR structure is used. With a single such stack, contacted in different modes, a high-precision angle sensor with 360 degrees of uniqueness can be realized.

The angle range of a conventional AMR angle sensor is depicted schematically in FIG. 1A. Because of the 90-degree uniqueness of a single AMR element signal, half-spaces of the signal (i.e., φ vs. φ+180 in the example of FIG. 1A) cannot be distinguished.

Figure 1B:
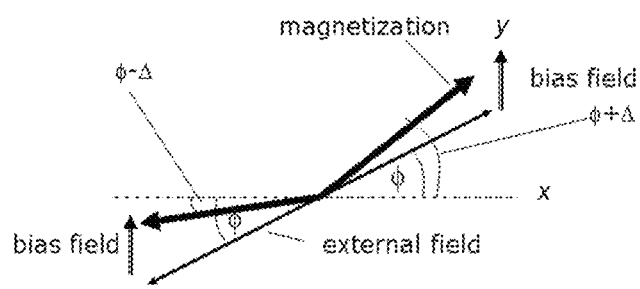
FIG. 1B is an angle diagram according to an embodiment.

If a comparatively low auxiliary magnetic field in the y-direction is applied, however, the magnetization of the AMR film varies slightly, as depicted by Δ in FIG. 1B. The measured angle thereby increases to φ+Δ if the actual angle of the external field is φ and decreases by Δ if the actual angle is φ+180.

Figure 1C:
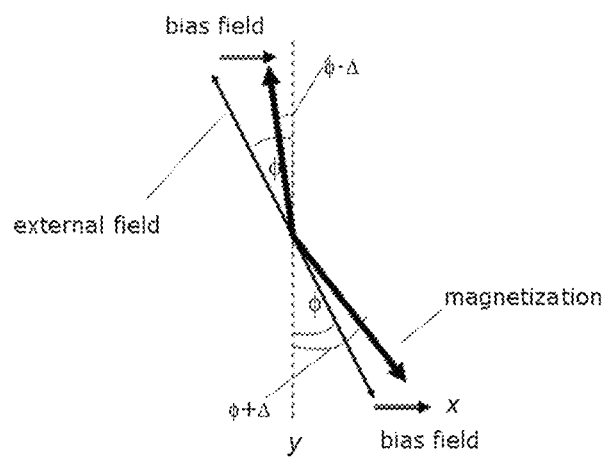
FIG. 1C is an angle diagram according to an embodiment.

If the external field is 90 degrees or 270 degrees, however, an auxiliary bias field in the x-direction can be applied, as depicted in FIG. 1C. The measured angle of a magnetic field in the +y direction will thereby be lowered, with a field in the −y direction enhanced. As a result, left and right half-spaces (as oriented in FIG. 1C) can be distinguished.

In contrast with conventional solutions, however, it is desired to achieve the bias fields on-chip permanently, rather than through coils or additional devices that apply temporary fields, and for the fields to have lower field strength than the external magnetic field. In embodiments, additional sensor structures are provided such that the AMR layer is directly magnetically coupled to a hard magnetic structure by the so-called exchange bias effect. The magnetization direction of the hard magnetic structure can be adjusted, as discussed herein below. In order to be able to evaluate the 360-degree unique signal regardless of external magnetic field direction, two additional Wheatstone bridges with different exchange bias directions are added to a conventional configuration in embodiments. The coupling field is smaller than the external rotating magnetic field in order to enable a rotation of the AMR magnetization.

Figure 2:
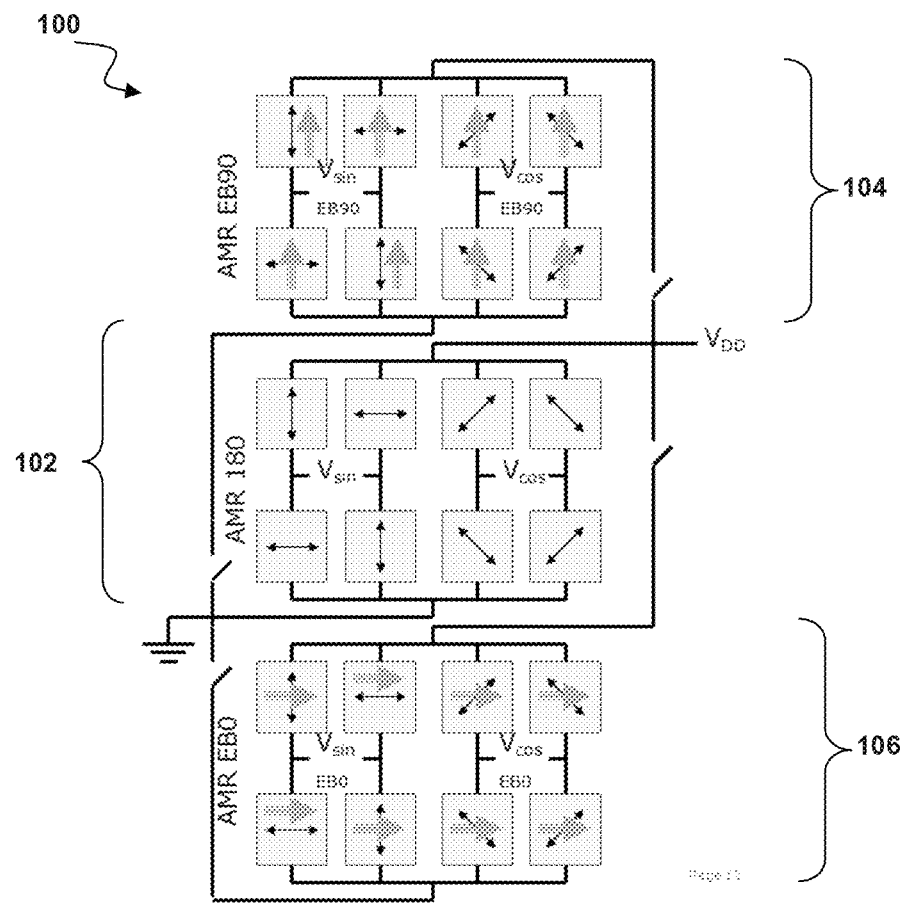
FIG. 2 is a block diagram of an AMR sensor configuration according to an embodiment.

Referring to FIG. 2, a sensor configuration according to an embodiment is depicted. Sensor 100 comprises a Wheatstone bridge portion 102 of a conventional AMR angle sensor having 180 degrees of uniqueness. Portion 102 comprises two full bridges rotated by 45 degrees with respect to one another, with the illustrated double arrows indicating the main current flow axis. Sensor 100 also comprises two additional Wheatstone full bridges 104 and 106, in which the AMR layers are magnetically coupled to a certain direction of exchange bias field indicated by the block-style arrows. In the embodiment of FIG. 2, the directions are 0 degrees and 90 degrees to form full bridges 104 and 106. The addition of bridges 104 and 106 increases active area; half-bridges with fixed, not magnetically active reference resistances can be used in other embodiments to reduce the added active area. Further, if 360-degree measurement is not needed at all times in some applications, exchange biased bridges 104 and 106 can be switched off from the supply Vdd to reduce power consumption.

In other embodiments, the angles of rotation can vary from the 45 degrees illustrated in FIG. 2. In general, however, the angles are not orthogonal. For example, the exchange biasing directions of the AMR portions of sensor 100 can be rotated by some degree in a range of 0 to 90 degrees or in a range of 90 to 180 degrees, in various embodiments. Resulting non-orthogonality can be compensated for by a calibration step during sensor production.

Figure 3A:
FIG. 3A is a block diagram of an AMR stack according to an embodiment.
Figure 3B:
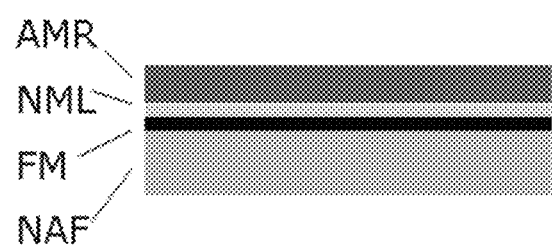
FIG. 3B is a block diagram of an AMR stack according to an embodiment.

The exchange bias effect has been used in GMR and TMR technologies to build a stable reference magnetization system in so-called "spin-valve" stack types. Referring to FIG. 3A, a natural anti-ferromagnetic layer (NAF) is coupled to a layer exhibiting an AMR effect, or an AMR layer. In FIG. 3B, a ferromagnetic (FM) layer, such as cobalt iron (CoFe) or nickel iron (NiFe), is in direct contact with an NAF, such as platinum manganese (PtMn), nickel manganese (NiMn) or iridium manganese (IrMn). Heating and cooling of the stack in a magnetic field leads to hard magnetization in the direction of the magnetic field through the exchange bias effect between the FM and the NAF. This same configuration can be used for the exchange biased AMR layer, with tuning of the exchange bias field strength possible in a restricted range by varying the NAF material, the thickness of the NAF layer or the AMR layer thickness. In embodiments, the AMR layer is comparatively thick, such as about 20 to about 30 nanometers (nm) and exhibits a significant magnetic moment that can lead to reasonable thermo-magnetic drift of the exchange bias field direction.

In FIG. 3B, the FM layer is in direction contact with the NAF layer. The FM layer thickness can be chosen to be only as thick as necessary to build a significant exchange bias and at the same time a minimum magnetic moment. Next to the FM layer is a non-magnetic coupling layer (NML), such as ruthenium (Ru). The thickness of the NML defines the coupling strength and sign, i.e. if the coupling is ferromagnetic or anti-ferromagnetic, between the exchange biased FM layer and the AMR layer on the side of the NML by the so-called Ruderman-Kittel-Kasuya-Yosida (RKKY)-exchange coupling. As a result, the effective bias field for the AMR layer can be tailored in a wide range by varying the NML thickness in embodiments. Furthermore, the direction of the imprinted exchange bias field is most stable, since the thin FM layer exhibits a minimum magnetic moment to be tilted in an external magnetic field.

Figure 4:
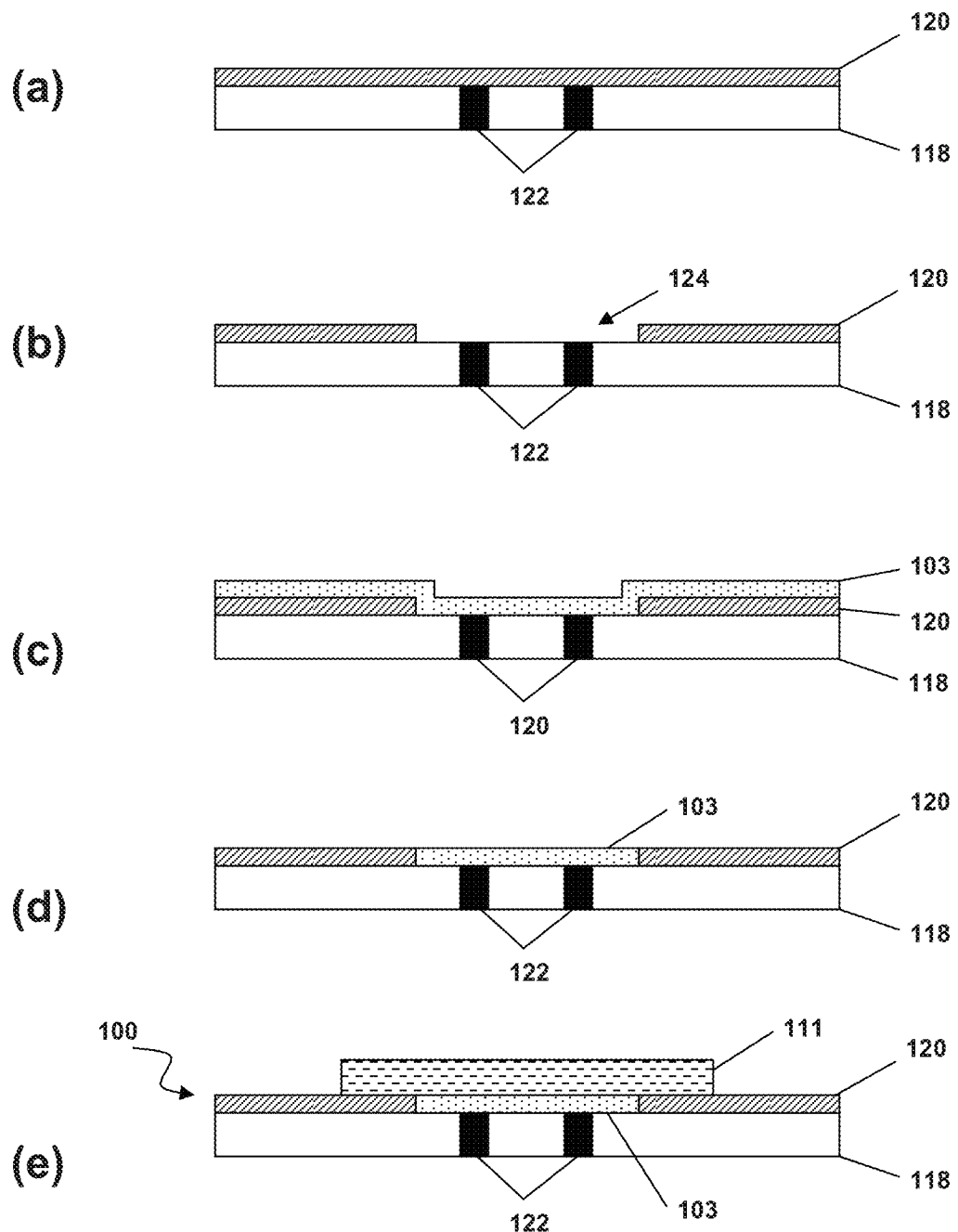
FIG. 4 is a block diagram sequence of a damascene process according to an embodiment.

The following will describe one way of processing structures with and without exchange biased AMR layers next to each other, in accordance with various embodiments. AMR relevant layers can be deposited in two steps, including a damascene process such as is described in co-pending U.S. application Ser. No. 12/946,460 entitled "XMR SENSORS WITH HIGH SHAPE ANISOTROPY" and which is incorporated herein by reference in its entirety. One example according to an embodiment will be described with respect to FIG. 4. Embodiments can include more or fewer steps than specifically illustrated, as understood by one skilled in the art; for example, a lithography process can occur between (a) and (b) but is not depicted.

At (a), a thin dielectric 120 is applied to a substrate 118. In an embodiment, substrate 118 has a polished surface on which dielectric 120 is applied and includes two vias 122 for later providing a connection to an underlying wiring metal. In embodiments, dielectric 120 comprises silicon nitride or oxide and is applied with a thickness approximately equal to that desired for exchange bias layer 103. Other suitable dielectric materials can be used in other embodiments. As depicted, vias 122 are plugged with tungsten during processing.

At (b), a groove 124 having the desired geometry of exchange bias layer 103 is etched into dielectric 120 with a high selectivity to the underlying oxide of substrate 118. In embodiments, a width of groove 124 is in a range of about 100 nm to about 10 µm, or smaller than the AMR structure.

At (c), exchange bias layer 103 is deposited. Exchange bias layer 103 as deposited can include a seed layer, a natural antiferromagnet layer and optional additional functional layers in embodiments; see, for example, FIGS. 3A and 3B.

At (d), a chemical-mechanical polishing (CMP) process removes the portions of exchange bias layer 103 on dielectric 120. Exchange bias layer 103 remains in former groove 124.

At (e), remaining stack 111 is deposited. In an embodiment, remaining stack 111 has been structured by a standard etch process, such as a chemical, plasma or sputter etch process, the dimensions of remaining stack 111 being relaxed relative to those of exchange bias layer 103, and is deposited after a conditioning process is carried out on polished exchange bias layer 103.

As a result, there are regions with and without the exchange biased AMR layer. Other methodologies, including those also discussed in the aforementioned co-pending application, can also be used in embodiments.

In another example, and referring to FIG. 5, the AMR structures with and without exchange biasing are stacked and deposited in a single step, separated by an insulator layer, such as aluminum oxide (Al2O3) or magnesium oxide (MgO). An additional wiring layer is introduced to provide contact from both sides of the stack, but active area can also be significantly reduced.

Two different directions of exchange bias magnetization also are to be imprinted. A first option for doing so is to use laser-aided local heating of the exchange biased AMR structures in a magnetic field. Such a process is conventionally used for GMR angle sensor processing, such as is described in co-owned U.S. Pat. No. 7,678,585, which is incorporated herein by reference. A drawback of this process, however, is that each sensor resistance is processed individually, which takes additional time.

Another example option involves processing the different magnetizations simultaneously for the whole wafer, such as is described in co-owned U.S. Patent Application Pub. No. 2010/0118447, which is incorporated herein by reference. Basically, a first orientation for all exchange biased structures is imposed in a wafer-level magnetization step. In a second non-magnetic anneal, the exchange bias direction is tilted according to the shape selected for the exchange bias system part of the AMR sensor, in other words for the shape anisotropy effect. The shape anisotropy is chosen to be different for the two exchange bias directions. Referring to FIGS. 6A and 6B, shape anisotropy can be achieved even if wide AMR sensor structures are used. The exchange bias section 602 is not homogeneous beneath the AMR layer 604 but rather is divided in several narrow portions, i.e., not all regions of AMR layer 604 are exchange biased coupled. This effects a weakening of the effective exchange bias coupling and should be considered when tailoring the exchange bias strength.

Figure 7A:
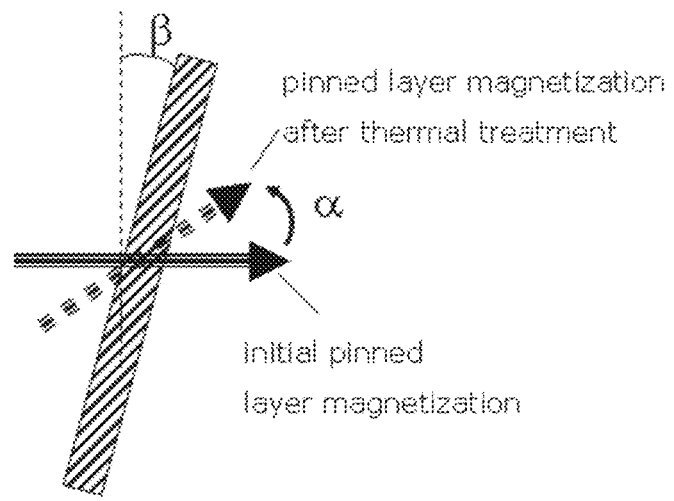
FIG. 7A is a block diagram of an AMR stripe according to an embodiment.
Figure 7B:
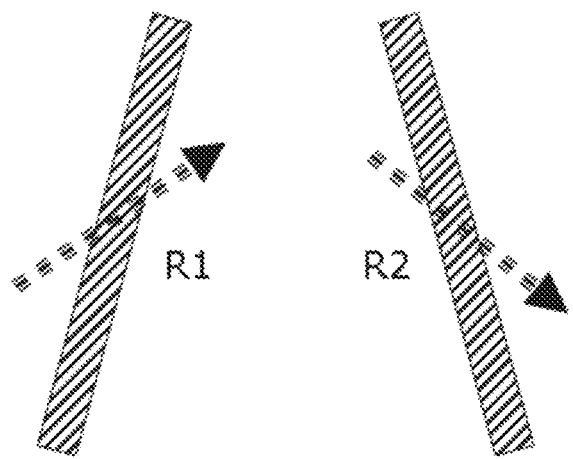
FIG. 7B is a block diagram of AMR stripes according to an embodiment.

Referring to FIG. 7A, the influence of the structure orientation on a reorientation of the pinned layer magnetization after a thermal treatment is illustrated. Assuming that there is an angle of 90 degrees-$\beta$ between the stripe length axis (shape) and the initial pinned layer magnetization, a thermal treatment with temperatures near the so-called "blocking" temperature of the system will lead to tilt of the magnetization by an angle $\alpha$. A proper configuration of the two types of geometries for the pinned layer system will lead to an angle of $2\alpha$ between the pinned layer magnetization. FIG. 7B illustrates generation of the two different pinned layer orientations by the geometry.

Figure 8:
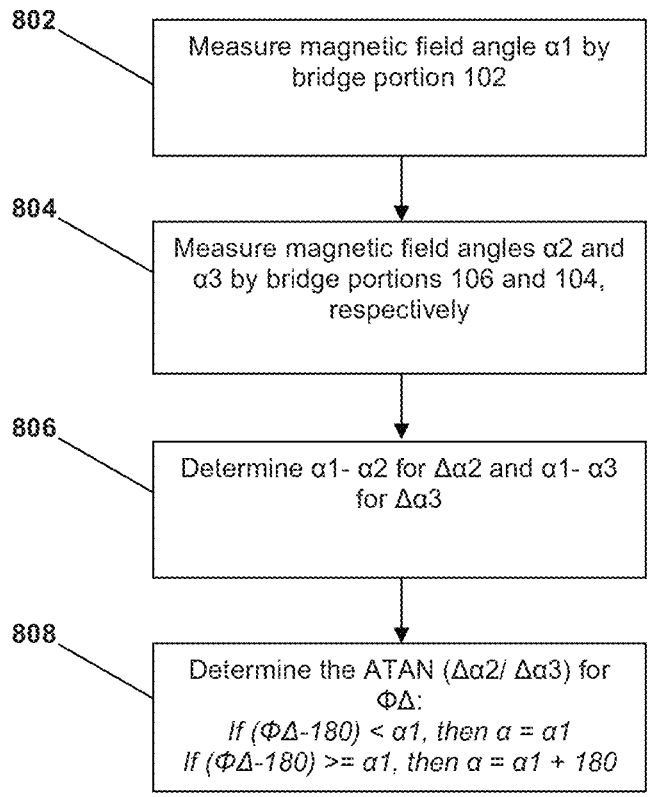
FIG. 8 is a flow chart of a process according to an embodiment.

Returning to the aforementioned challenge of determining 360-degree uniqueness in conventional AMR angle sensors, embodiments discussed herein provide a multitude of possibilities for determining 360-degree uniqueness. A first approach includes implementing additional CORDIC (COordinate Rotation Digital Computer) calculations without making any assumptions, as illustrated in FIG. 8 with reference to FIG. 2.

Figure 9:
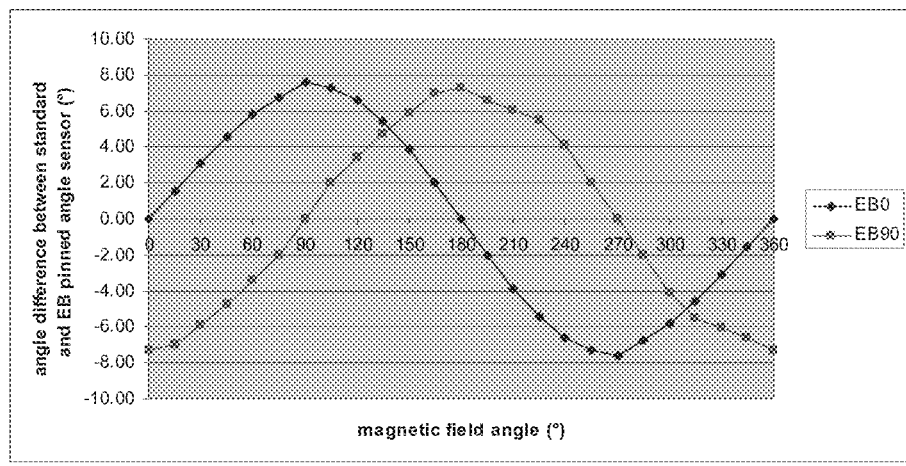
FIG. 9 is a simulated plot of angle difference versus magnetic field angle according to an embodiment.

At 802, the magnetic field angle $\alpha 1$ is measured by sensor portion 102. At 804, magnetic field angles $\alpha 2$ and $\alpha 3$ are measured by sensor parts 106 and 104, respectively. In an embodiment, 804 is carried out at the same time as 802. At 806, measured angle differences are calculated: $\alpha 1-\alpha 2=\Delta\alpha 2$ and $\alpha 1-\alpha 3=\Delta\alpha 3$. The result is a sine- and cosine-like characteristic (refer, for example, to the simulated results of FIG. 9) that can be used to determine 360-degree uniqueness. Thus, at 808, the arctan (ATAN) of $(\Delta\alpha 2/\Delta\alpha 3)$ is determined for $\phi\Delta$. If $\phi\Delta-180$ degrees is less than $\alpha 1$, then the actual angle, $\alpha$, is $\alpha 1$; if $\phi\Delta-180$ degrees is greater than or equal to $\alpha 1$, then $\alpha$ is $\alpha 1+180$ degrees.

Figure 10:
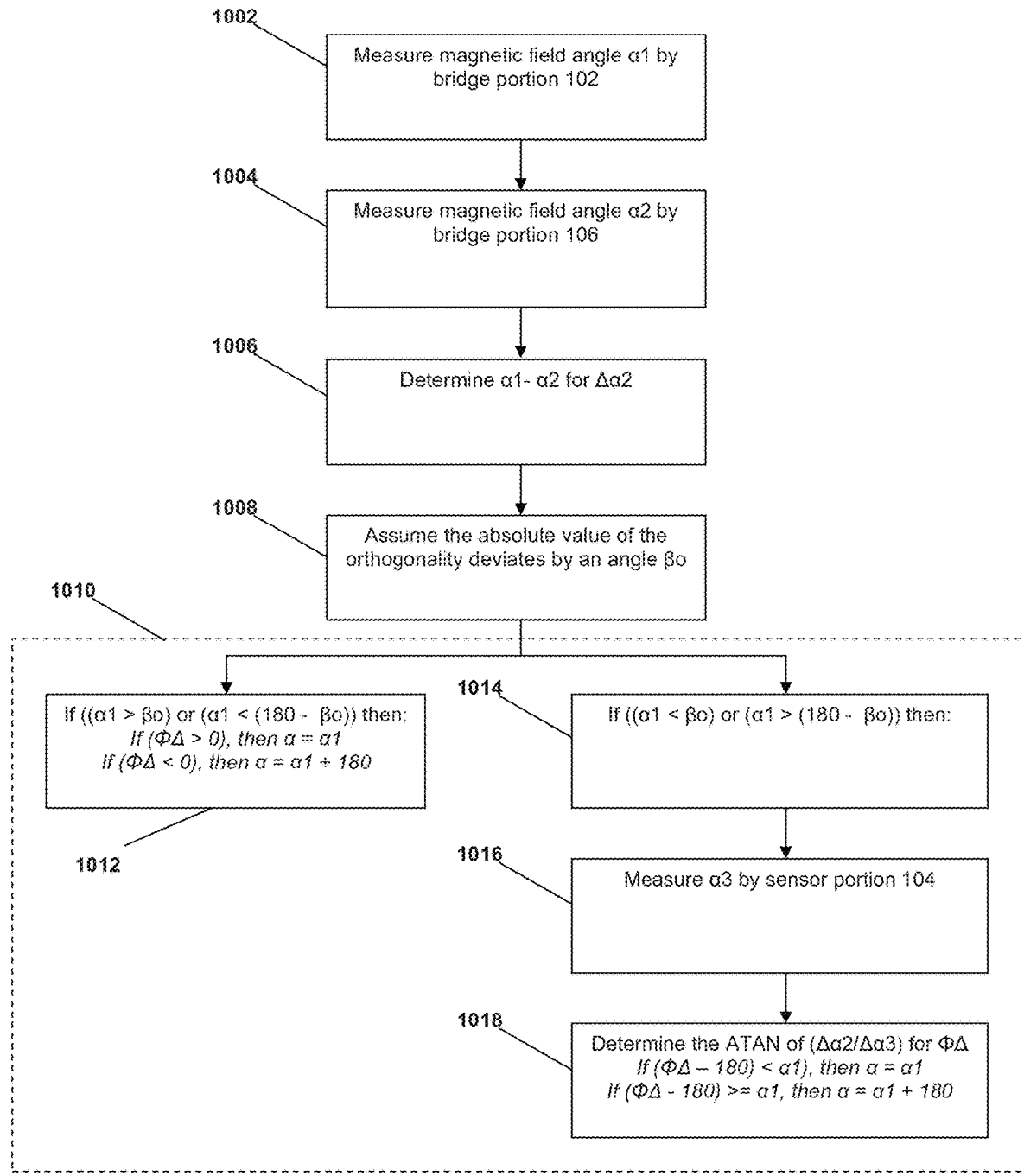
FIG. 10 is a flow chart of a process according to an embodiment.

Another method for determining $\alpha$ with 360-degree uniqueness with fewer additional CORDIC calculations but an assumption of a misalignment of the two orthogonal exchange bias directions is depicted in FIG. 10 with reference to FIG. 2. This process takes advantage of the fact that the half-space is clearly defined by the value $\Delta\alpha 2$ except at or around the zero crossings (e.g., 0 and 180 degrees under ideal conditions).

At 1002, the magnetic field angle $\alpha 1$ is measured by sensor portion 102. At 1004, magnetic field angle $\alpha 2$ is measured by sensor portion 106. In an embodiment, 1004 is carried out at the same time as 1002. At 1006, the measured angle difference is calculated: $\alpha 1-\alpha 2=\Delta\alpha 2$. At 1008, an assumption is made that the absolute value of the orthogonality deviates by an angle $\beta o$. Then, at 1010, the real angle, $\alpha$, is calculated. At 1012, if $((\alpha 1>\beta o)$ or $(\alpha 1<(180-\beta o))$, then: if $(\phi\Delta>0)$, then $\alpha=\alpha 1$, or if $(\phi\Delta<0)$, then $\alpha=\alpha 1+180$. At 1014, if $((\alpha 1<\beta o)$ or $(\alpha 1>(180-\beta o))$, then at 1016, $\alpha 3$ is measured by sensor portion 104. At 1018, the ATAN of $(\Delta\alpha 2/\Delta\alpha 3)$ is determined for $\phi\Delta$. If $\phi\Delta-180$ degrees is less than $\alpha 1$, then the actual angle, $\alpha$, is $\alpha 1$; if $\phi\Delta-180$ degrees is greater than or equal to $\alpha 1$, then $\alpha$ is $\alpha 1+180$ degrees.

Accurate alignment of the two exchange bias direction with respect to one another or to the basic current directions is not necessary, as long as the directions are defined within an 180-degree accuracy. Therefore, a realistic drift of the exchange bias directions during sensor lifetime does not affect the 360-degree recognition.

Embodiments thus relate to AMR angle sensors which couple the AMR layer to the pinned layer in order to effect 360-degree uniqueness. As previously mentioned, however, the desired half-space information could be provided by a GMR or TMR spin-valve sensor structure, which inherently can provide a 360-degree unique signal angle. As also previously mentioned, there are inherent advantages to AMR sensors structures that make them desirable for at least some applications. Thus, further embodiments aim to take advantage of simultaneous AMR and TMR effects by including a TMR structure in a current-in-plane (CIP) configuration to accomplish the same or similar 360-degree uniqueness effects.

Figure 11:
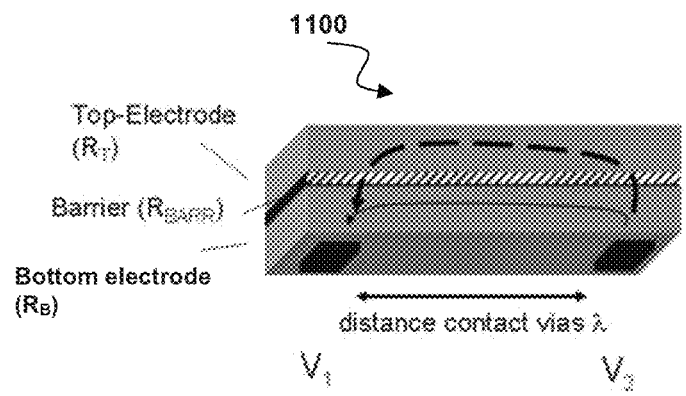
FIG. 11 is a block diagram of a TMR stack according to an embodiment.
Figure 12:
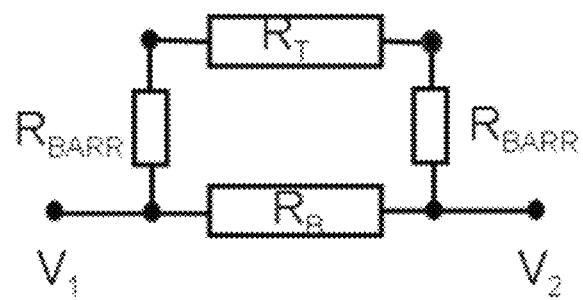
FIG. 12 is an equivalent circuit diagram of the stack of FIG. 11.

Referring to FIG. 11, a TMR stack 1100 can be described as top and bottom electrodes separated by a tunnel barrier, resulting in an equivalent circuit as depicted in FIG. 12. When a voltage is applied to the terminal contacts, a voltage gradient over the barrier also exists, giving rise to a TMR signal that is lower than the maximum possible signal for a conventional current-perpendicular-to-plane (CPP) mode due to a shunting current through the top and bottom electrodes.

Figure 13:
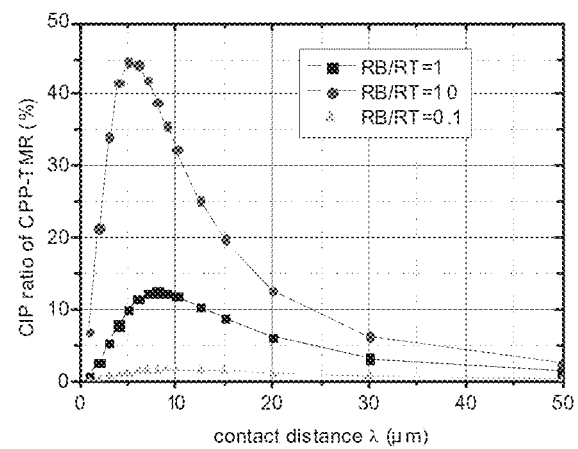
FIG. 13 is a simulated plot of CIP ratio of CPP TMR versus contact distance according to an embodiment.

As mentioned above, embodiments utilize TMR structures in CIP configurations. Referring to FIG. 13, there are two main influencing factors of CIP signals: an optimum contact distance with a maximum CIP TMR signal, and the ratio of top and bottom resistance values. Regarding the former, for lower distances, the bottom electrode shortens the whole stack and only a small amount of current flows through the barriers. For larger contact distances, the element resistance is mainly determined by the parallel resistance of the top and bottom electrodes and dominates the resistance change by the TMR effect.

Figure 14:
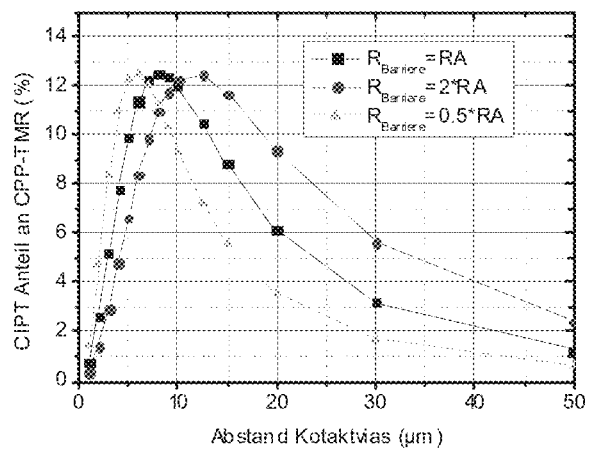
FIG. 14 is a simulated plot of CIP ratio of CPP TMR versus contact distance according to an embodiment.

Regarding the second factor, in order to get as much current as possible through the barrier (i.e., a high signal), the bottom electrode should exhibit a high resistance ($R_B$), the top electrode a low resistance ($R_T$). The achievable CIP ratio of the maximum CPP signal significantly increases with a rising $R_B/R_T$ ratio. The resistance of the barrier has no major influence on the signal height but on the distance value for the optimum signal height: the higher the barrier resistance, the wider the contacts for an optimum CIP TMR effect. Refer to FIG. 14.

Figure 15:
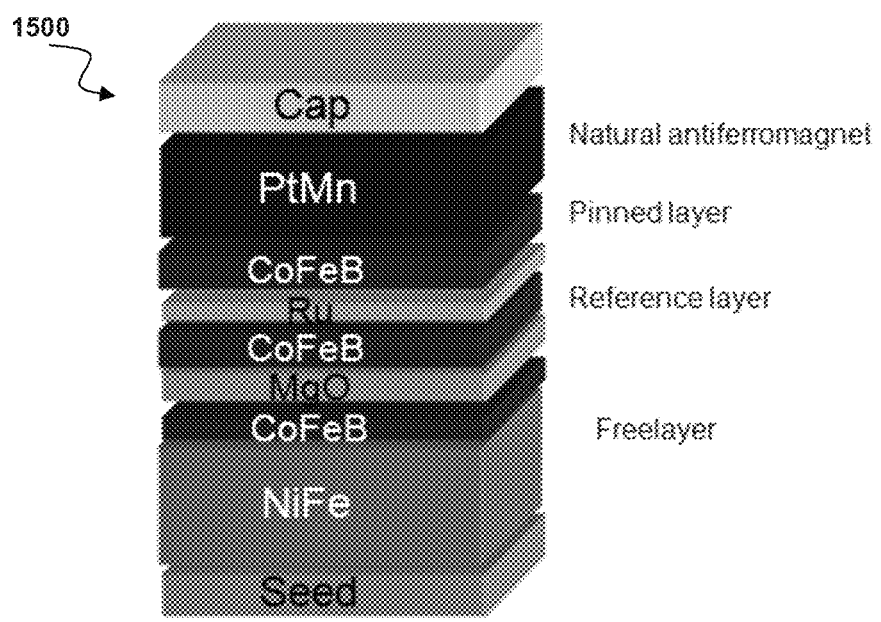
FIG. 15 is a TMR stack according to an embodiment.

The strong influence of the contact distance on the current distribution through the TMR stack can be used to make either only the bottom electrode or the whole stack measurable. According to embodiments, the TMR stack is provided with a layer exhibiting an AMR effect, such as a permalloy layer. This layer can be about 15 to about 30 nm thick in embodiments and can comprise, for example, NiFe, which per se exhibits an AMR effect, such as about 3% (dR/R) in an embodiment. An example TMR spin-valve stack 1500 is depicted in FIG. 15, in which the permalloy layer of NiFe in an embodiment acts as the free layer. The contacts are located on the free layer side. For small contact distances, the current mainly flows through the bottom electrode, the electrode located at the contact side (i.e., through the AMR layer). Consequently, only the magnetic properties of the bottom electrode, the layer with the AMR effect, can be observed. Referring again to FIG. 13, the TMR effect can be suppressed, depending on the stack design, and a high-precision 180-degree angle sensor is obtained. At elevated contact distances, a maximum CIP TMR effect can be measured. If the CIP TMR effect is higher than the AMR effect or if the AMR effect can be suppressed by certain measures, a 360-degree unique angle signal can be detected. As a result, and according to embodiments, a high precision AMR angle signal and 360-degree information can be obtained with the same stack by choosing adapted contact distances.

Figure 16:
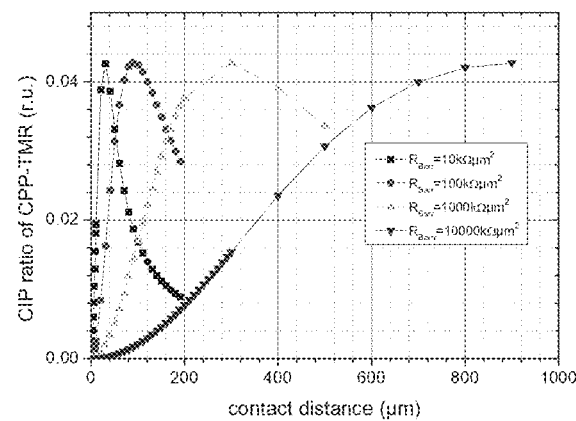
FIG. 16 is a simulated plot of CIP ratio of CPP TMR versus contact distance according to an embodiment.
Figure 17:
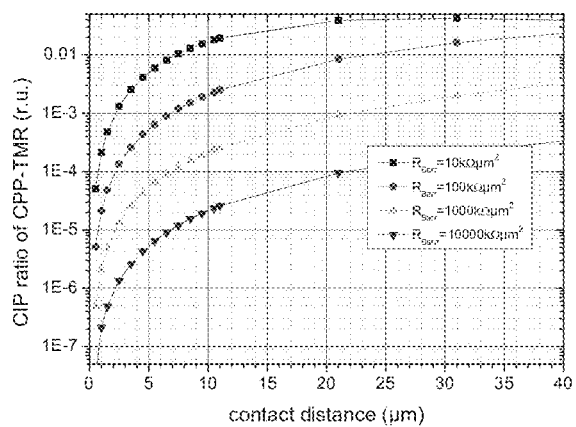
FIG. 17 is a simulated plot of CIP ratio of CPP TMR versus contact distance according to an embodiment.
Figure 18:
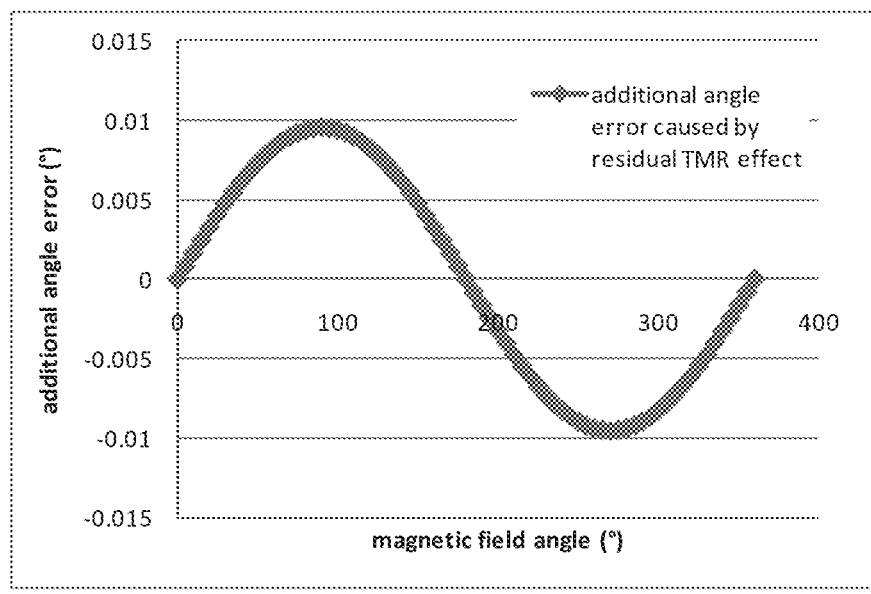
FIG. 18 is a simulated plot of angle error versus magnetic field angle according to an embodiment.

FIG. 16 depicts the results of a two-dimensional numerical simulation for the CIP signal versus contact distance behavior of an exemplary TMR stack with, as in one example embodiment, a 20 nm NiFe free layer, a 1 nm reference layer, a 2 nm pinned layer and a 15 nm natural antiferromagnet material such as PtMn. With increasing barrier resistance, the CIP TMR signal can be drastically reduced in the small contact distance region. For example, FIG. 17 shows, for typical barrier layer resistance of $Rbarr=10^7 \Omega\mu m^2$ and a contact distance of 7 μm, a CIP TMR ratio of the CPP TMR signal of $10^\wedge-3\%$. Assuming a CPP TMR effect of about 100%, the remaining CIP TMR signal is then $10^\wedge-3\%$. With an AMR effect of about 3%, the overall signal of the structure is clearly dominated by the AMR signal of the free layer. An evaluation of the AMR signal slightly modulated with the residual CIP TMR signal under aforementioned conditions results in an additional angular error (maximum) 0.01 degrees, which is almost negligible. Refer to FIG. 18. This means that, even with the disturbing TMR signal, a high-precision AMR angle signal is obtained.

Relatedly, the necessary small contact distance of about 10 μm in an embodiment works quite well with the concept of a high-precision AMR angle sensor as disclosed in co-pending and co-owned U.S. application Ser. No. 12/950,456, incorporated herein by reference in it entirety and which discusses a series connection of single circular elements with a diameter of about 10 μm in an embodiment.

Figure 19:
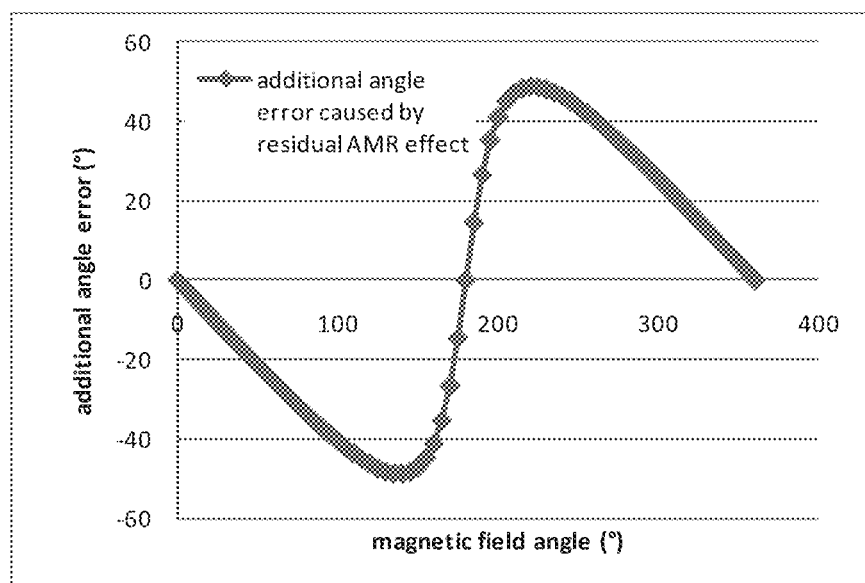
FIG. 19 is a simulated plot of angle error versus magnetic field angle according to an embodiment.

In embodiments having contact distances of greater than 200 μm, such as about 700 μm, a CIP TMR signal of greater than about 4% is expected, which is higher than the unwanted remaining AMR effect of about 3% previously discussed. FIG. 19 depicts an additional angle error by the AMR signal modulated CIP TMR signal of about 50 degrees, which is still sufficient because only 180-degree accuracy is required in order to obtain the correct half-space information.

Nevertheless, it is possible to almost completely suppress the unwanted AMR effect for the structures in which the CIP TMR effect is extracted by combining elements with orthogonal current directions; then the AMR effect cancels out. In this case, no additional error has to be taken into account for the CIP TMR structure. Another possibility is the usage of an extended plate with point contact areas along a line, resulting in a wide current direction distribution; such a structure does not show a reasonable AMR effect. An alternative option is to choose the larger contact distance to measure the AMR effect. Referring again to FIG. 16, a decrease of the CIP TMR signal can be seen for larger contact distances and smaller barrier resistances.

Therefore, sensor embodiments can comprise two types of angle sensor structures: one with a small contact distance, one with a wider distance. As a result, one measures only the AMR effect of the free layer (high precision 180-degree unique angle signal), the other measures only the CIP TMR effect (low precision 360-degree unique angle signal) taking into account measuring for the AMR effect suppression. In contrast with pure GMR/TMR angle sensors, the reference system of the stack does not need to be especially stable; an accuracy drift of several 10-degrees can be tolerated as the absolute accuracy need only be less than about 180 degrees. As a result, a sensor structure according to embodiments can provide a high precision angular accuracy even for high temperatures and external magnetic fields, such as up to about 100 mT, which providing the advantages of a single stack and no additional GMR processing.

Figure 20:
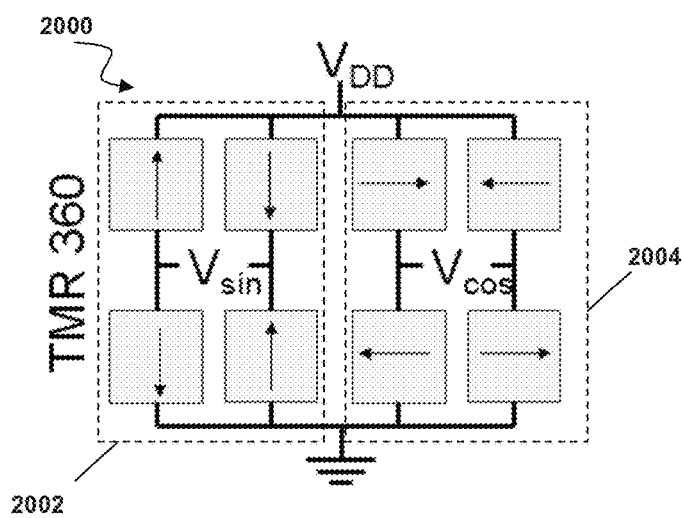
FIG. 20 is a block diagram of a TMR sensor structure according to an embodiment.

Thus, and referring to FIG. 20, a Wheatstone bridge configuration 2000 according to an embodiment is depicted. Bridge configuration 2000 is an example TMR angle sensor component comprising two full Wheatstone bridges 2002 and 2004. Arrows indicate the magnetization direction of the reference magnetization of the TMR spin-valve stack. The necessary local definition of the reference magnetization direction can be achieved, for example, by a laser magnetization process as previously discussed herein. Within each full bridge 2002 and 2004, the magnetization directions are aligned anti-parallel; between the two full bridges 2002 and 2004 the direction are rotated by 90 degrees.

Figure 21:
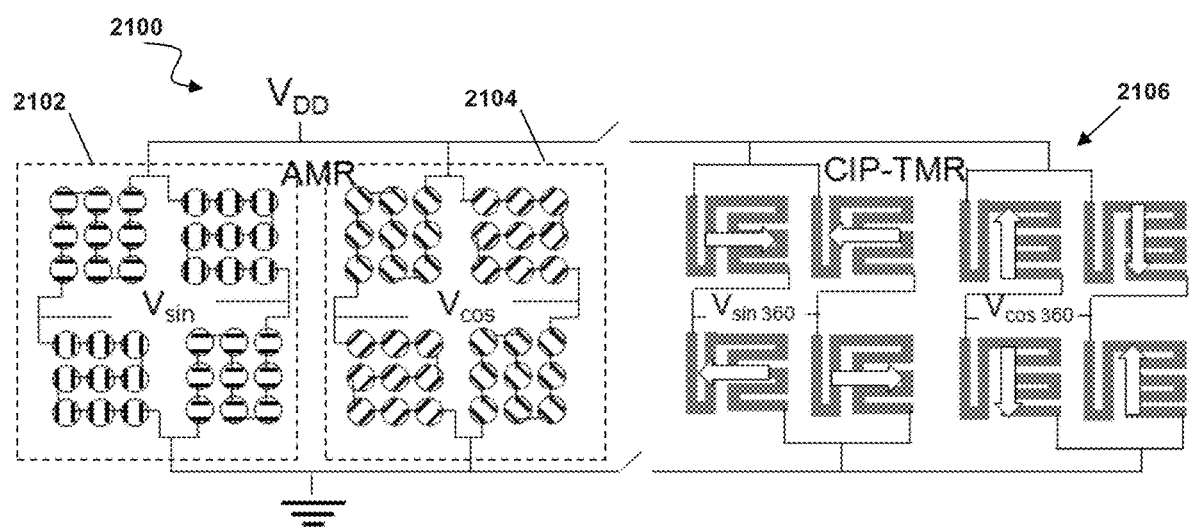
FIG. 21 is a block diagram of a sensor structure according to an embodiment.

A sensor structure 2100 according to an embodiment is depicted in FIG. 21. Sensor 2100 comprises full Wheatstone bridges 2102 and 2104 with single resistances, each comprising a series connection of circular-shaped structures with defined contact areas, wherein the contact distance is small to suppress the CIP TMR signal of the stack. Here, the contact distance of each resistor is high enough to exhibit a significant CIP TMR effect. Furthermore, a meander structure with orthogonal current orientation is chosen to reduce the AMR signal influence on the CIP TMR signal. The arrows in the CIP TMR portion 2106 indicate the locally imprinted magnetization directions. In embodiments, CIP TMR portion 2106 can be designed as a half-bridge in order to reduce current consumption and active area. Additionally, there is no need for a wide stripe width, since a low angular error for CIP TMR portion 2106 is not mandatory; it is only needed to determine the half-space of the external magnetic field, thus only 180-degree accuracy is required. Furthermore, CIP TMR portion 2106 can be switched on or off by switches in embodiments in order to be activated only at the beginning of sensor operation for current-saving purposes.

Figure 22:
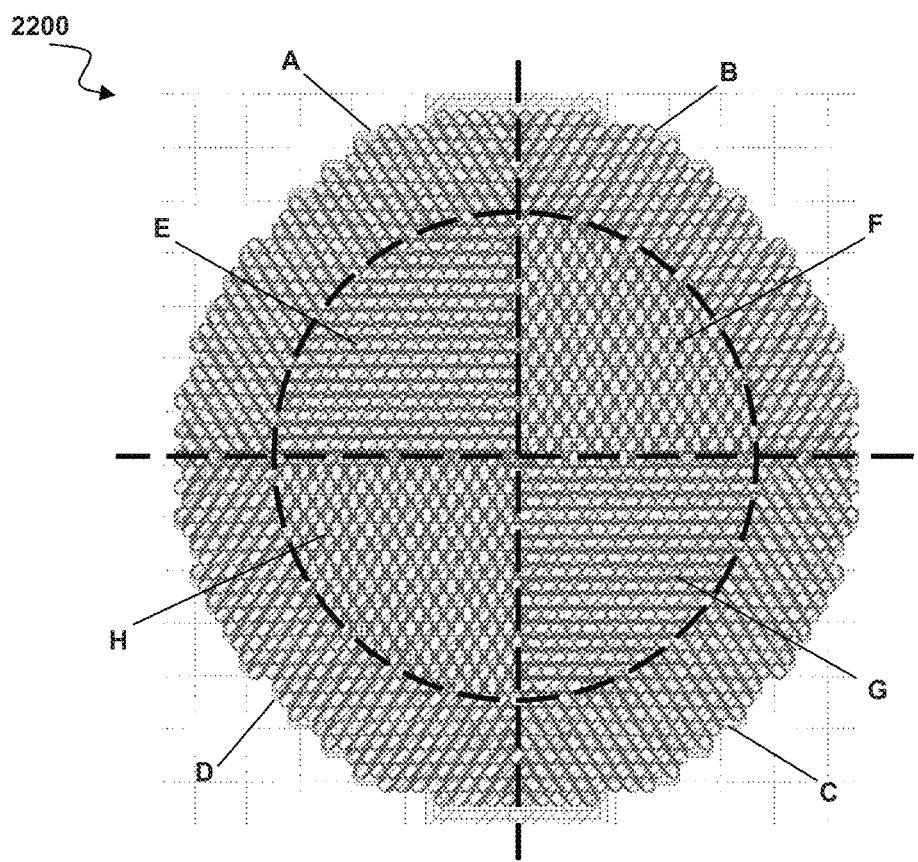
FIG. 22 is a block diagram of a sensor structure according to an embodiment.

FIG. 22 depicts an advantageous bridge layout 2200 having a series connection of single circular sensor elements, with eight resistances (A, B, C, D, E, F, G and H) included. The entire bridge 2200 is designed in a circular structure, which minimizes the active area at certain resistances. As a consequence, the additional angular errors caused by displacements of the external magnet in the system can be reduced.

It should also be noted that the TMR sensor portion can be operated in the customary TMR current-perpendicular-to-plane CPP configuration. In such embodiments, contacts on the second side of the tunneling barrier are also included, in addition to the contacts on the first side of the tunneling barrier.

Embodiments thus relate to xMR sensors, in particular AMR angle sensors with an angle range of 360 degrees. In embodiments, AMR angle sensors with a range of 360 degrees combine conventional, highly accurate AMR angle structures with structures in which an AMR layer is continuously magnetically biased by an exchange bias coupling effect. The equivalent bias field is lower than the external rotating magnetic field and is applied continuously to separate sensor structures. Thus, in contrast with conventional solutions, no temporary, auxiliary magnetic field need be generated, and embodiments are suitable for magnetic fields up to about 100 mT or more. Additional embodiments relate to combined TMR and AMR structures. In such embodiments, a TMR stack with a thick permalloy free layer, functioning as an AMR structure, is used. With a single such stack, contacted in different modes, a high-precision angle sensor with 360 degrees of uniqueness can be realized.

Various embodiments of systems, devices and methods have been described herein. These embodiments are given only by way of example and are not intended to limit the scope of the invention. It should be appreciated, moreover, that the various features of the embodiments that have been described as well as of the claims may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments and/or from different claims, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An angle sensor for measuring an external magnetic field with 360 degrees of uniqueness, comprising:
   a first anisotropic magnetoresistive (AMR) sensor element comprising a first AMR sensor layer;
   a first exchange bias effect biasing stack comprising multiple layers underlying and integrated with the first AMR sensor element;
   an insulating layer underlying the exchange bias effect biasing stack;
   a second exchange bias effect biasing stack underlying the insulating layer such that a magnetization direction of the second exchange bias effect biasing stack is rotated with respect to a magnetization direction of the first exchange bias effect biasing stack;
   a second AMR sensor element comprising a second AMR sensor layer underlying the second exchange bias effect biasing stack such that the second AMR sensor element and the second exchange bias effect biasing stack mirror the first AMR sensor element and the first exchange bias effect biasing stack about the insulating layer; and
   one or more contacts connected to the second AMR sensor layer.

2. The angle sensor of claim 1, wherein the first AMR sensor layer comprises an AMR sensor stack comprising multiple layers.

3. The angle sensor of claim 2, further comprising one or more contacts overlying the first AMR sensor element.

4. The angle sensor of claim 1, wherein the first exchange bias effect biasing stack comprises:
   an anti-ferromagnetic layer;
   a ferromagnetic layer overlying the anti-ferromagnetic layer; and
   a non-magnetic coupling layer overlying the ferromagnetic layer,
   wherein the non-magnetic coupling layer is disposed between the ferromagnetic layer and the first AMR sensor element.

5. The angle sensor of claim 4, wherein the anti-ferromagnetic layer comprises a material selected from the group consisting of platinum manganese (PtMn), nickel manganese (NiMn) and iridium manganese (IrMn).

6. The angle sensor of claim 4, wherein the non-magnetic coupling layer comprises Ru.

7. The angle sensor of claim 1, wherein the first AMR sensor layer comprises a material selected from the group consisting of cobalt iron (CoFe) and nickel iron (NiFe).

8. The angle sensor of claim 1, wherein the first AMR sensor layer has a thickness in a range of about 10 nm to about 30 nm.

9. The angle sensor of claim 1, wherein the first exchange bias effect biasing stack comprises an antiferromagnetic layer, and wherein the first AMR sensor layer is coupled to the antiferromagnetic layer by at least one of a ferromagnetic layer and a non-magnetic coupling layer.

10. The angle sensor of claim 1, wherein the first AMR sensor element, in operation, is biased via the first exchange bias effect biasing stack with a bias magnetic field for at least a given period of time.

11. The angle sensor of claim 10, wherein the bias magnetic field is smaller than the external magnetic field.

12. The angle sensor of claim 1, wherein the second AMR sensor layer comprises an AMR sensor stack comprising multiple layers.

13. The angle sensor of claim 1, wherein the insulating layer comprises aluminum oxide or magnesium oxide.

14. The angle sensor of claim 1, wherein a bias direction of the first and second exchange bias effect biasing stacks is different from one another.

15. The angle sensor of claim 1, wherein the second AMR sensor layer comprises a ferromagnetic material.

* * * * *